United States Patent [19]

Tsukamoto

[11] Patent Number: 5,705,858
[45] Date of Patent: Jan. 6, 1998

[54] PACKAGING STRUCTURE FOR A HERMETICALLY SEALED FLIP CHIP SEMICONDUCTOR DEVICE

[75] Inventor: Kenji Tsukamoto, Tokyo, Japan

[73] Assignee: NEC Corporation, Tokyo, Japan

[21] Appl. No.: 227,385

[22] Filed: Apr. 14, 1994

[30] Foreign Application Priority Data

Apr. 14, 1993 [JP] Japan .................. 5-112204

[51] Int. Cl.⁶ .................. H01L 23/48; H01L 23/52; H01L 29/40
[52] U.S. Cl. .................. 257/778; 257/779; 257/780
[58] Field of Search .................. 257/778–780

[56] References Cited

FOREIGN PATENT DOCUMENTS

| 3824008 | 1/1990 | Germany | 257/778 |
|---|---|---|---|
| 60-220939 | 11/1985 | Japan | 257/780 |
| 63-095638 | 4/1988 | Japan | 257/779 |
| 03270030 | 12/1991 | Japan | 257/779 |
| 04030544 | 2/1992 | Japan | 257/780 |
| 04370958 | 12/1992 | Japan | 257/778 |
| 06061368 | 3/1994 | Japan | 257/778 |
| 8700686 | 1/1987 | WIPO | 257/779 |

*Primary Examiner*—Mahshid D. Saadat
*Assistant Examiner*—T. M. Arroyo
*Attorney, Agent, or Firm*—Sughrue, Mion, Zinn, Macpeak & Seas, PLLC

[57] ABSTRACT

A packaging structure for a semiconductor device has plural hermetically sealed units each containing a flip-chip electrically interconnected to an intermediate substrate, circuit patterns of the flip-chips being within the sealed environment. Each hermetically sealed unit is connected to a base wiring substrate through soldered electrodes. Replacement of a flip-chip is accomplished by melting the solder joints between the flip-chip's respective hermetically sealed unit and the base wiring substrate. The flux vapor given off during this replacement process does not damage the circuit patterns of nearby flip-chips because they are contained in a sealed environment. Additionally, the electrodes between the flip-chips and intermediate substrate and between intermediate substrates and the base wiring layer contain projections which prevent crushing of solder between opposing electrodes and deformation of the flip-chip under a heavy load.

11 Claims, 2 Drawing Sheets

PACKAGING STRUCTURE FOR A HERMETICALLY SEALED FLIP CHIP SEMICONDUCTOR DEVICE

BACKGROUND OF THE INVENTION

1. Field of the Invention

The present invention relates to a semiconductor device, and more particularly to a semiconductor device having a packaging structure for preventing the solder flux used in the package structure from influencing circuit patterns formed on one major surface of flip-chips.

2. Description of the Related Art

First will be described a conventional semiconductor device having a packaging structure with reference to FIG. 1, which is a cross-sectional view of such a conventional semiconductor device.

Referring to FIG. 1, the conventional semiconductor device has a configuration in which auxiliary substrates 23 are interposed between a printed circuit board 27 and flip-chips 21 (see, for example, Japanese Utility Model Laid-Open Publication No. sho 62151742). Connecting pins 26 are respectively mounted on electrodes 28 formed over an upper surface of the printed circuit board 27, and support respective auxiliary substrates 23.

Electrodes 24 formed over each upper surface of the auxiliary substrates 23 are electrically connected to the connecting pins 26. The flip-chips 21 provided with electrodes 22 are respectively mounted on the auxiliary substrates 23 to electrically connect between the electrodes 22 formed over each lower surface of the flip-chips 21 and the electrodes 24 through solder bumps 25.

In addition, the auxiliary substrate 23 can be formed equivalent or smaller than the flip-chips 21, so that the packaging density can be the same as when the flip-chips 21 are directly mounted on the printed circuit board 27.

However, the above-described conventional packaging structure for a semiconductor device has a disadvantage.

To replace a flip-chip 21 one either has to remove the flip-chip from its respective auxiliary substrate 23 or remove the flip-chip together with its auxiliary substrate from the printed circuit board 27. In the former case the solder connections between the electrodes 22 and 24 are heated to melt the solder and separate the flip-chip from its auxiliary substrate. In the latter case the solder joints between connecting pins 26 and electrodes 28 are heated to melt the solder and thereby detach the pins 26 from the electrodes 28. In either case the heating of the solder connections gives off flux associated with the solder. This flux vapor spreads to nearby flip-chips. As the lower major surfaces of the flip-chips contain unprotected circuit patterns, the flux vapor is likely to damage these circuit patterns.

On the other hand, in the case of a soldering method which does not use the flux, it is necessary to maximize the size of apparatus for soldering to put the whole printed circuit board 27 in an $N_2$ gas atmosphere.

SUMMARY OF THE INVENTION

It is therefore an object of the present invention to eliminate the above-mentioned disadvantage and provide a semiconductor device having a packaging structure capable of preventing the above-mentioned flux used in the case of soldering from influencing circuit patterns formed on one major surface of flip-chips.

According to the present invention, a semiconductor device having a packaging structure has:

chips respectively having at least one circuit pattern and first electrodes formed over one major surface thereof;

intermediate substrates respectively having second electrodes formed in positions corresponding to the first electrodes on one major surface thereof, and third electrodes electrically connected to the second electrodes on the other major surface thereof; and seal means respectively interposed between the one major surface of the chips and the one major surface of the intermediate substrates for fully hermetically sealing the at least one circuit pattern of the chips.

BRIEF DESCRIPTION OF THE DRAWINGS

The above objects and features of this invention will become more apparent from the following detailed description when taken in conjunction with the attached drawings.

DESCRIPTION OF THE PREFERRED EMBODIMENT

Next will be described an embodiment of the present invention with reference to FIG. 2.

Figure 1:
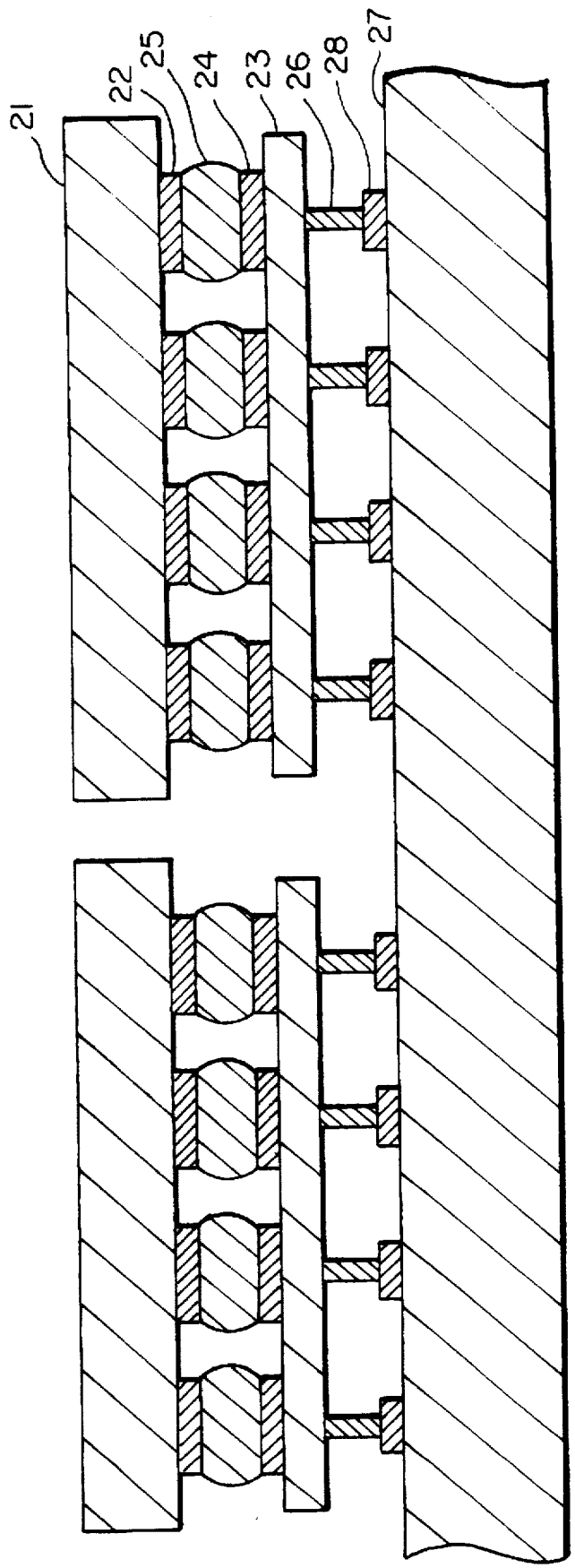
FIG. 1 is a cross-sectional view of a conventional semiconductor device having a packaging structure related to the present invention.
Figure 2:
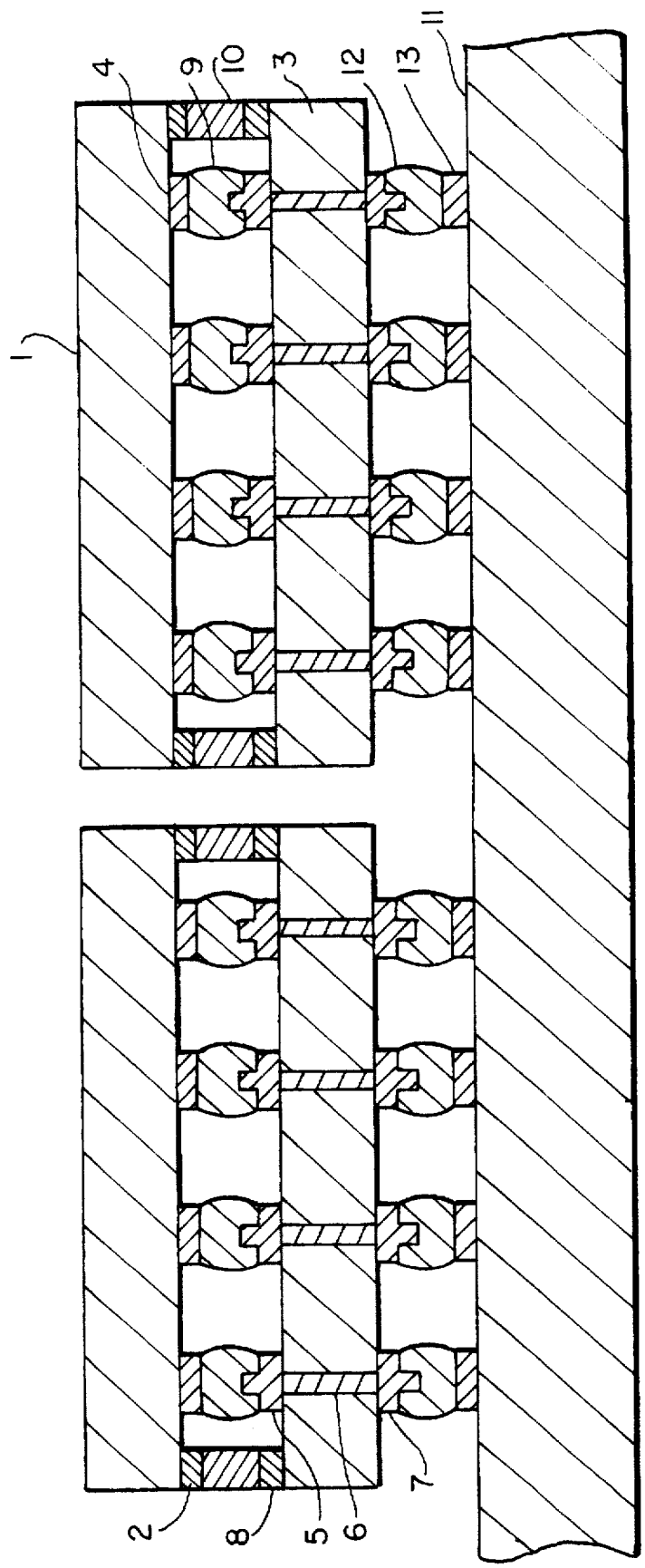
FIG. 2 is a cross-sectional view of an embodiment of a semiconductor device having a packaging structure according to the present invention.

Referring to FIG. 2, a packaging structure for a semiconductor device according to an embodiment of the present invention has flip-chips 1, connecting portions 2, intermediate substrates 3, electrodes 4, electrodes 5, through holes 6, electrodes 7, connecting portions 8, solder bumps 9, rings 10, a base wiring substrate 11, solder bumps 12, and electrodes 13.

The connecting portions 2 are respectively formed on the peripheral portions of lower surfaces of the flip-chips 1, and may be gold coated by a gold-tin solder. Electrodes 4 are respectively formed on the lower surfaces of the flip-chips 1, and are preferably provided with a cylindrical configuration of about 0.1 mm in diameter, and may be gold.

The intermediate substrates 3 respectively have the same area of about 25 $mm^2$ to 400 $mm^2$ as the flip-chips 1, and have substantially the same thickness of about 0.5 mm as the flip-chips 1, and may be AlN, SiN, $Al_2O_3$, and glass ceramic.

The electrodes 5 are respectively formed on the upper surfaces of the intermediate substrates 3 in positions corresponding to electrodes 4, and are preferably provided with a cylindrical configuration of about 0.1 mm in diameter, and may be gold.

Similarly, the electrodes 7 are respectively formed on the lower surfaces of the intermediate substrates 3 in positions corresponding to electrodes 5 formed on the upper surfaces of the intermediate substrates 3, and are preferably provided with a cylindrical configuration of about 0.1 mm in diameter, and may be copper.

The electrodes 5 are respectively electrically connected to electrodes 7 by through holes 6 formed within the intermediate substrate 3. The through holes 6 are preferably provided with a cylindrical configuration of about 0.05 to 0.09 mm in diameter, and are preferably filled with conductive pastes such as tungsten pastes.

The electrodes 5 and 7 of the intermediate substrate 3 respectively preferably have a projection portion in the center of the surface thereof, and each projection portion is preferably provided with a cylindrical configuration of about 0.03 to 0.07 mm in diameter and of about 0.03 to 0.05 mm in height.

The connecting portions 8 are respectively formed on the peripheral portion of the upper surfaces of the intermediate substrates 3, and may be gold coated by a gold-tin solder.

The flip-chips 1 and the intermediate substrates 3 are respectively electrically connected to each other by solder bumps 9, which may be made from gold-tin solder.

The rings 10 are respectively interposed between the flip-chips 1 and the intermediate substrates 3, and are connected at an upper surface thereof to the connecting portions 2 of the flip-chips 1 and at a lower surface thereof to the connecting portions 8 of the intermediate substrates 3 by soldering to create a complete hermetical seal between the flip-chips 1 and the intermediate substrates 3.

Also, the rings 10, which may be metal or silicone or polyimide resin, are preferably provided with a thickness of about 0.05 to 0.1 mm, and preferably have an equivalent coefficient of linear expansion substantially the same as that of the flip-chips 1.

Such a packaging structure of the flip-chips 1 and the intermediate substrates 3 is connected to the base wiring substrate 11 by solder bumps 12 based on a following method.

First, the electrodes 13 are respectively formed on the upper surfaces of the base wiring substrate 11 in positions corresponding to electrodes 7 formed on the lower surfaces of the intermediate substrates 3, and are preferably provided with a cylindrical configuration of about 0.1 mm in diameter, and may be copper.

Thereafter, creamy solder is applied over the electrodes 13 of the base wiring substrate 11 by a screen printing method.

Next, while the electrodes 7 of the intermediate substrates 3 and the electrodes 13 of the base wiring substrate 11 are respectively aligned with each other, the packaging structure of the flip-chips 1 and the intermediate substrates 3 is mounted on the upper surface of the base wiring substrate 11.

Subsequently, the creamy solder is melted by a reflow furnace apparatus to form solder bumps 12. At this time, due to the surface tension of the solder bumps 12, the electrodes 7 and the electrodes 13 are physically spaced apart from each other as shown in FIG. 2.

The melting point of the solder bumps 12 used between the intermediate substrates 3 and the base wiring substrate 11 is approximately 183° C., and the melting point of the solder bumps 9 used between the electrodes 4 of the flip-chips 1 and the electrodes 5 of the intermediate substrates 3 and the connecting portions 2 and 8 used for connecting rings 10 to the flip-chips 1 and the intermediate substrates 3 is approximately respectively 280° C.

Under this condition, when the packaging structure of the flip-chips 1 and the intermediate substrates 3 is removed from the base wiring substrate 11, the whole semiconductor device is heated to a temperature higher than about 180° C. which is the melting point of solder bumps 12, but lower than about 280° C. which is the melting point of solder bumps 9 and the connecting portions 2 and 8.

As a result, only the solder bumps 12 are melted, so that the packaging structure of the flip-chips 1 and the intermediate substrates 3 is removed from the base wiring substrate 11 while electrodes 4, 5 and solder bumps 9 between the flip-chips 1 and the intermediate substrates 3 remain completely hermetically sealed by rings 10.

Although the rings 10 increase the distance between the flip-chips 1 and the intermediate substrates 3, the electrical connection between the electrodes 4 and 5 are sufficiently achieved by the projections protruding upwardly from the upper surfaces of the electrodes 5.

Also, the projections protruding vertically from the upper surfaces of the electrodes 5 are sufficient to prevent the intermediate portion of flip-chips 1 from deforming by a heavy load when a cooling block or something like that is provided on the flip-chips 1. This is because the projections will abut a respective electrode 4 before a deformation can occur.

The projections protruding downwardly from the lower surfaces of the electrodes 7 are also sufficient to prevent the solder bumps 12 from being short-circuited by preventing the crushing of the solder bumps 12 and a resulting shorting of crushed solder bumps when a heavy load of the packaging structure of the flip-chips 1 and the intermediate substrates 3 are placed on the base wiring substrate 11.

The projections of electrodes 5 and 7 are preferably provided with a cylindrical or substantially cylindrical configuration. Further, the electrodes 4 and 13 may be provided with a multiform configuration, such as pentagon or octagon.

If the packaging structure of the flip-chips 1 and the intermediate substrates 3 is not subjected to flip-chip connection, the electrodes 7 may be replaced with conventional connecting pins.

As described above, since the present invention has the connecting portions and the rings for fully hermetically sealing the electrodes provided between the flip-chips and the intermediate substrates, it is therefore possible to protect the surface of the flip-chips formed with circuit patterns from damage due to the removal of the flip-chips 1 from the base wiring substrate 11.

Moreover, since this is provided projections protruding vertically from the upper and lower surfaces of the intermediate substrates, it is possible to prevent the solder bumps from being short-circuited by preventing crushing of the solder bumps causing contact between them when a heavy load, such as the packaging structure of the flip-chips 1 and the intermediate substrates 3 or cooling blocks, is provided.

Although the present invention has been fully described by way of a preferred embodiment thereof with reference to the accompanying drawings, various changes and modifications will be apparent to those having skill in this field. Therefore, unless these changes and modifications otherwise depart from the scope of the present invention, they should be construed as included therein.

What is claimed is:

1. A semiconductor device having a packaging structure, comprising:

a semiconductor chip having at least one circuit pattern and first electrodes formed over one major surface thereof;

an intermediate substrate respectively having second electrodes formed in positions corresponding to said first electrodes on one major surface thereof, and third electrodes electrically connected to said second electrodes on the other major surface thereof; and seal means respectively interposed between said one major surface of said chip and said one major surface of said intermediate substrate for substantially, fully hermetically sealing said at least one circuit pattern of said chip, said seal means comprising connecting portions respectively formed on said one major surface of said chip and said intermediate substrate, and a ring connected to said connecting portions.

2. A semiconductor device having a packaging structure as claimed in claim 1, wherein said connecting portions respectively comprise gold covered with gold-tin.

3. A semiconductor device having a packaging structure as claimed in claim 1, wherein said ring comprises a material selected from the group consisting of metal, silicone, or polyimide resin.

4. A semiconductor device having a packaging structure as claimed in claim 1, wherein said intermediate substrate has through holes formed therein for electrically connections between said second electrodes and said third electrodes.

5. A semiconductor device having a packaging structure as claimed in claim 1, wherein said first electrodes of said chip and said second electrodes of said intermediate substrate are electrically connected by solder.

6. A semiconductor device having a packaging structure as claimed in claim 5, wherein said solder comprise, gold-tin solder.

7. A semiconductor device having a packaging structure as claimed in claim 1, wherein said second electrodes have a projection formed on each upper surface thereof.

8. A semiconductor device having a packaging structure as claimed in claim 1, wherein said third electrodes have a projection formed on each lower surface thereof.

9. A semiconductor device having a packaging structure as claimed in claim 1, further comprising a base wiring substrate provided with fourth electrodes on one major surface thereof in positions corresponding to said third electrodes.

10. A semiconductor device having a packaging structure as claimed in claim 9, wherein said third electrodes of said intermediate substrates and said fourth electrodes of said base wiring substrate are electrically connected by solder.

11. A semiconductor device having a packaging structure as claimed in claim 10, said solder comprise, tin-lead solder.

* * * * *